(12) United States Patent
Wang

(10) Patent No.: US 8,772,864 B2
(45) Date of Patent: Jul. 8, 2014

(54) TRENCH MOSFET DEVICE AND METHOD FOR FABRICATING THE SAME

(75) Inventor: Jiakun Wang, Wuxi (CN)

(73) Assignees: CSMC Technologies Fab1 Co., Ltd., Wuxi (CN); CSMC Technologies Fab2 Co., Ltd., Wuxi (CN)

( * ) Notice: Subject to any disclaimer, the term of this patent is extended or adjusted under 35 U.S.C. 154(b) by 0 days.

(21) Appl. No.: 13/807,612

(22) PCT Filed: Nov. 29, 2011

(86) PCT No.: PCT/CN2011/083129
§ 371 (c)(1),
(2), (4) Date: Dec. 28, 2012

(87) PCT Pub. No.: WO2012/079456
PCT Pub. Date: Jun. 21, 2012

(65) Prior Publication Data
US 2013/0093008 A1 Apr. 18, 2013

(30) Foreign Application Priority Data
Dec. 17, 2010 (CN) .......................... 2010 1 0593571

(51) Int. Cl.
*H01L 29/66* (2006.01)
(52) U.S. Cl.
USPC .......................................... 257/330; 438/589
(58) Field of Classification Search
USPC ......... 438/270, 424, 430, 478, 530, 587, 706, 438/708, 73, 112, 138, 14; 257/33, 257/E29.262, E21.41
See application file for complete search history.

(56) References Cited

U.S. PATENT DOCUMENTS

| | | | |
|---|---|---|---|
| 5,982,001 A * | 11/1999 | Wu | 257/344 |
| 2002/0179967 A1* | 12/2002 | Fujishima | 257/330 |
| 2003/0201514 A1 | 10/2003 | Radens et al. | |
| 2006/0022218 A1 | 2/2006 | Masumoto et al. | |
| 2008/0164520 A1* | 7/2008 | Darwish | 257/334 |

FOREIGN PATENT DOCUMENTS

| | | |
|---|---|---|
| CN | 1455459 A | 11/2003 |
| CN | 1556546 A | 12/2004 |
| CN | 101385147 A | 3/2009 |
| CN | 101645447 A | 2/2010 |

* cited by examiner

*Primary Examiner* — Julio J Maldonado
*Assistant Examiner* — Robert Bachner
(74) *Attorney, Agent, or Firm* — Anova Law Group, PLLC

(57) ABSTRACT

A trench Metal-Oxide-Semiconductor Field-Effect Transistor (MOSFET) device is disclosed. The trench MOSFET device includes a substrate, a body region, a source region, a dielectric layer, a metal layer, a contact hole, and a trench structure. The substrate includes a substrate layer and an epitaxial layer formed on the substrate layer; the body region is formed in the epitaxial layer; and the source region is formed in the body region of the epitaxial layer. Further, the dielectric layer is formed on the epitaxial layer; the metal layer is formed on the dielectric layer; and the contact hole is formed in the dielectric layer to connect the source region with the metal layer. In addition, the trench structure is formed in the epitaxial layer, and the trench structure includes a first trench that is a pectinate trench including a plurality of tooth trenches and a bar trench interconnecting the plurality of tooth trenches.

19 Claims, 4 Drawing Sheets

TRENCH MOSFET DEVICE AND METHOD FOR FABRICATING THE SAME

FIELD OF THE INVENTION

The present invention generally relates to the field of semiconductor manufacturing and, more particularly, to the Metal-Oxide-Semiconductor Field-Effect Transistor (MOSFET) technologies.

BACKGROUND

Metal-Oxide-Semiconductor Field Effect Transistor (MOSFET) devices are being developed towards two main directions. The first direction is for high voltage and ultrahigh voltage applications. That is, the MOSFET devices have rather high breakdown voltages while having relative low on-state resistance, and the MOSFET devices developed towards this direction generally have a very thick low-doped epitaxial layer for bearing high voltage. Therefore, the drift resistance in the epitaxial layer becomes a major factor in the on-state resistance. The second direction is for low voltage and ultralow voltage applications. That is, the MOSFET devices have very small on-state resistance and fast switching speed instead of long duration for withstanding high voltages.

In order to achieve small on-state resistance, low-voltage MOSFET devices require more and smaller cells to construct. Early low-voltage MOSFET devices were produced by adopting planar structures. However, the planar structure is inadequate for reducing the area of a single cell, and therefore does not facilitate in realizing very small on-state resistance. Now, the MOSFET devices are generally made by adopting a trench technology (the MOSFET devices made by this technology are called trench MOSFET devices). This trench technology can tremendously increase the density of the cells and can be good for decreasing the on-state resistance.

When fabricating the low-voltage MOSFET devices using the trench technology, the requirement for the low-voltage MOSFET devices to withstand voltages is relatively low. Thus, the epitaxial layer of the low-voltage MOSFET devices can be thinner or doping concentration can be higher, and the proportion from the drift resistance of the epitaxial layer in the on-state resistance decreases. The influence of the channel resistance to the on-state resistance also increases. Further, if the density of the cells is fixed, decreasing the channel resistance can effectively decrease the on-state resistance. Moreover, if the length of the channel is fixed, the channel resistance can be decreased by widening the width of the channel.

The trenches formed by the conventional process are generally strip-type or square-type trenches. For example, FIG. 1 shows a top view of strip-type trenches and contact hole in a MOSFET cell. As shown in FIG. 1, the cell includes two separated strip-type trenches 1 and 2 (referring to the shaded area) and a contact hole 3 between the strip-type trenches 1 and 2. Further, FIG. 2 shows a top view of a square-type trench and contact hole in another MOSFET cell. As shown in FIG. 2, the cell includes a square trench 4 which forms a circular channel and a contact hole 5 disposed in an area surrounded by the circular channel.

FIG. 3 shows a cross-sectional view taken along the line AA' in FIG. 1. As shown in FIG. 3, the cell includes a substrate layer 6, an epitaxial layer 7, a dielectric layer 8, and a metal layer 9 superposed sequentially. The epitaxial layer 7 includes the strip-type trenches 1 and 2, a body region 11 located between the strip-type trenches 1 and 2, and a source region 10 in the body region 11. The contact hole 3 goes through the dielectric layer 8 and extends to the body region 11 in the epitaxial layer 7, and the contact hole 3 is used to connect the source region 10 with the metal layer 9. The height d from the bottom of the source region 10 to the bottom of the body region 11 is then the length of the channel. The total length of the dashed line along the edge of the trench (FIGS. 1 & 2) is the width of the channel.

Therefore, if the length of the channel is fixed, the width of the channel is determined by a strip-type trench or a square trench and it may be difficult to increase the width furthermore. Thus, it may be hard to decrease the channel resistance to reduce the on-state resistance under the conventional fabricating processes. The disclosed methods and systems are directed to solve one or more problems set forth above and other problems.

BRIEF SUMMARY OF THE DISCLOSURE

One aspect of the present disclosure includes a trench Metal-Oxide-Semiconductor Field-Effect Transistor (MOSFET) device. The trench MOSFET device includes a substrate, a body region, a source region, a dielectric layer, a metal layer, a contact hole, and a trench structure. The substrate includes a substrate layer and an epitaxial layer formed on the substrate layer; the body region is formed in the epitaxial layer; and the source region is formed in the body region of the epitaxial layer. Further, the dielectric layer is formed on the epitaxial layer; the metal layer is formed on the dielectric layer; and the contact hole is formed in the dielectric layer to connect the source region with the metal layer. In addition, the trench structure is formed in the epitaxial layer, and the trench structure includes a first trench that is a pectinate trench including a plurality of tooth trenches and a bar trench interconnecting the plurality of tooth trenches.

Another aspect of the present disclosure includes a method for fabricating a trench Metal-Oxide-Semiconductor Field-Effect Transistor (MOSFET) device. The method includes providing a substrate including a substrate layer and an epitaxial layer formed on the substrate layer and forming a trench structure in the epitaxial layer using a trench pattern. The trench pattern includes a first pattern for a first trench that is a pectinate trench including a plurality of tooth trenches and a bar trench interconnecting the plurality of tooth trenches. The method also includes forming a body region in the epitaxial layer; forming a source region in the body region of the epitaxial layer; and forming a dielectric layer on the epitaxial layer. Further, the method includes forming a contact hole formed in the dielectric layer, and forming a metal layer on the dielectric layer, wherein the contact hole is filled with metal material to connect the source region with the metal layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 4:
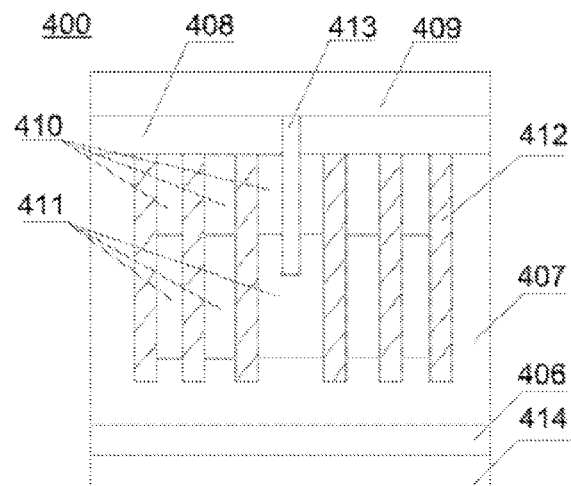
FIG. 4 illustrates a cross-sectional view of an exemplary trench MOSFET device consistent with the disclosed embodiments.

FIG. 4 illustrates a cross-sectional view of an exemplary trench MOSFET device 400 consistent with the disclosed embodiments. As shown in FIG. 4, trench MOSFET device 400 includes a substrate containing a substrate layer 406 and an epitaxial layer 407 formed on the substrate layer 406. The trench MOSFET device 400 also includes a trench structure 412 (referring to the shaded area) located in the epitaxial layer 407 and a contact hole 413. The trench structure 412 (or simply trench 412) may include a comb-shaped plurality of grooves or a plurality of pectinate grooves/trenches.

The trench MOSFET device 400 also includes a body region 411 formed in the epitaxial layer 407 and a source region 410 in the body region 411. Further, MOSFET device 400 includes a dielectric layer 408 formed on the epitaxial layer 407, and a metal layer 409 formed on the dielectric layer 408. The contact hole 413 goes through the dielectric layer 408 and connects to metal layer 409, and metal material is filled in the contact hole 413 to electrically connect the source region 410 with metal layer 409.

The substrate may include any appropriate material for making double-gate structures. For example, the substrate may include a semiconductor structure, e.g., silicon, silicon germanium (SiGe) with a monocrystalline, polycrystalline, or amorphous structure. The substrate may also include a hybrid semiconductor structure, e.g., carborundum, indium antimonide, lead telluride, indium arsenide, indium phosphide, gallium arsenide or gallium antimonide, alloy semiconductor, or a combination thereof. Further, the substrate may include a silicon-on-insulator (SOI) structure. In addition, the substrate may also include other materials, such as a multi-layered structure of epitaxial layer or buried layer. Other materials may also be used.

In certain embodiments, the substrate layer 406 may be an N-type monocrystal silicon, and the epitaxial layer 407 may be light-doped monocrystal silicon formed on the N-type monocrystal silicon. Further, the lattice structure of the epitaxial layer 407 may be the same as that of the substrate layer 406, but may have higher purity and fewer defects on the lattice structure than the substrate layer 406. In certain other embodiments, the substrate layer 406 may be germanium, indium phosphide, gallium arsenide or other semiconductor material.

To form the trench 412 located in the epitaxial layer 407, a photoresist layer is coated on the epitaxial layer 407, and a pectinate pattern of the trench 412 is formed in the photoresist layer by exposing the photoresist using a mask of the pectinate pattern and followed by developing the photoresist (i.e., photolithography). After forming the photoresist layer with pectinate pattern on the epitaxial layer 407, the trench 412 is formed in the epitaxial layer 407 by an etching process using the photoresist layer with the pectinate pattern of the trench 412 as a mask. The depth of the trench 12 may be controlled by controlling the etching time of the etching process.

Further, gate oxide and gate materials are filled in the trench 412 in sequence. In certain embodiments, the gate oxide may be silicon dioxide, and the gate material may be polysilicon. Other materials may also be used. That is, the trench structure 412 is filled with gate oxide and polysilicon to form a gate region of the MOSFET device 400 controlling a channel of the MOSFET device 400.

The body region 411 in the epitaxial layer 407 may be a P-type doped body region formed by diffusion, and the source region 410 in the body region 411 may be N-type doped. Further, the dielectric layer 408 on the epitaxial layer 407 may be silicon dioxide, and the metal layer 409 on the dielectric layer 408 may be titanium or aluminum copper alloy. The contact hole 413 may be filled with any appropriate metal material, such as the metal Wolframium. In addition, a drain 414 may be formed on the back side of the substrate.

Figure 5:
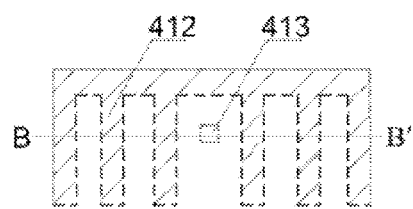
FIG. 5 illustrates a top view of an exemplary trench structure with a contact hole consistent with the disclosed embodiments.

The trench structure 412 may include a plurality of grooves/trenches in a pectinate configuration, and the plurality of grooves are interconnected in the epitaxial layer 407. FIG. 5 illustrates a top view of the trench 412 and contact hole 413 corresponding to the MOSFET device 400 shown in FIG. 4. As shown in FIG. 5, the trench 412 includes six "tooth" grooves/trenches and one "bar" groove/trench interconnecting the six "tooth" trenches. The total length of the dashed lines is the width of the channel.

As a result, compared with the conventional strip-type or square-type trenches, the pectinate trench 412 may be used to substantially increase the width of the channel and, thus, the channel resistance can be further reduced. The contact hole 413 may be located at the middle position among the six "tooth" trenches, and the distance between the contact hole 413 and the trenches next to the contact hole 413 is determined to meet certain fabrication process requirements. FIG. 4 is a cross-sectional view along the cross section line BB' from FIG. 5.

Figure 6:
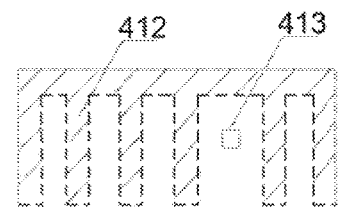
FIG. 6 illustrates a top view of another exemplary trench structure with a contact hole consistent with the disclosed embodiments.

Although FIG. 5 shows a total six "tooth" trenches, the number of the "tooth" trenches is not limited and may be any appropriate number. In a particular cell, the trench 412 may include a different number of "tooth" trenches by adjusting the distance between the "tooth" trenches and the width of the "tooth" trenches. Further, the location of the contact hole 413 is not limited either. FIG. 6 illustrates a top view of another configuration of the trench 412 and contact hole 413 consistent with the disclosed embodiments.

As shown in FIG. 6, the pectinate trench 412 still includes six "tooth" trenches and the contact hole 413 is located between the second "tooth" trench and the third "tooth" trench from the right side of the pectinate trench 412. Other configurations may also be used.

As described above, the pectinate trench 412 in the trench MOSFET device 400 may increase the width of the channel of the trench MOSFET device 400 and reduce the channel resistance. The channel resistance $R_{ch}$ can be expressed as:

$$R_{ch} = L_{ch}/W^* C_{ox}^* u^* (V_g - V_{th}) \qquad (1)$$

Where $L_{ch}$ is the length of the channel, W is the width of the channel, $C_{ox}$ is the gate capacitance, u is the carrier mobility ratio, $V_g$ is the gate voltage, and $V_{th}$ is the threshold voltage According to expression (1), when the length of the channel (which is also the distance between the bottom of the source region 410 and the bottom of the body region 411) is fixed, the channel resistance can be reduced by increasing the width W of the channel. Thus, the on-state resistance is also reduced.

Alternatively or additionally, the trench MOSFET device 400 may include trenches in different configurations, such as different number of trenches, different shapes, and different arrangement of the trenches to achieve the objective of increasing the width of the channel and decreasing the channel resistance. The different trenches may be formed in the epitaxial layer 407 by using a mask corresponding to a particular configuration of the various trenches.

For example, the trench MOSFET device 400 (e.g., the trench structure of the MOSFET device 400) may include two trenches coupled together (a first trench and a second trench), and each of the two trenches may be a pectinate, square, hexagon, circle, or part of the square, hexagon, and circle trench. Same as previously mentioned, the gate oxide layer and gate material are filled both in the first trench and the second trench.

Figure 7:
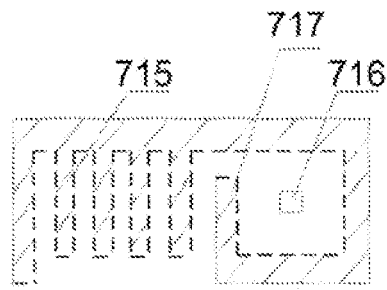
FIG. 7 illustrates top view of two interconnected trenches with a contact hole consistent with the disclosed embodiments.

FIG. 7 illustrates an exemplary configuration of trenches in the trench MOSFET device 400 consistent with the disclosed embodiments. As shown in FIG. 7, the trench MOSFET device 400 (e.g., a cell of the trench MOSFET device 400) may include a first trench 715 and a second trench 717, and the first trench 715 is different from the second trench 717. For example, as shown in FIG. 7, the first trench 715 is a pectinate trench, and the second trench 717 is an opened square trench.

The first trench 715 and the second trench 717 are interconnected, and a contact hole 716 is located in an area surrounded by the second trench 717. Other location may also be used to place the contact hole 716. Thus, the total length of the dashed lines shown in FIG. 7 is the width of the channel. Compared with the conventional trench MOSFET devices, the width of the channel is significantly increased and the channel resistance is decreased.

Further, as shown in FIG. 7, the second trench 717 may be different from the conventional square-type trench. For example, under the two-trench configuration, the second trench 717 does not form a circle channel. In other words, if the second trench 717 were designed to be a conventional square-type trench, two contact holes may be needed for the two trenches. Thus, the two-trench configuration as shown in FIG. 7 also reduces the number of contact holes used in the trench MOSFET device 400.

On the other hand, the first trench 715 includes a plurality of "tooth" trenches, and the length of the "tooth" trenches of the first trench 715 may be different. For example, the length of the "tooth" trenches in the middle is shorter than the length of the "tooth" trench on the border. Because there are thousands and thousands of cells in a die, the different length of the "tooth" trenches may be further used to distinguish "tooth" trenches from different neighboring cells.

Figure 8A:
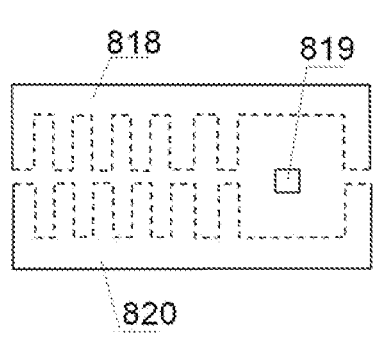
FIG. 8A illustrates a top view of two symmetric trenches with a contact hole consistent with the disclosed embodiments.
Figure 8B:
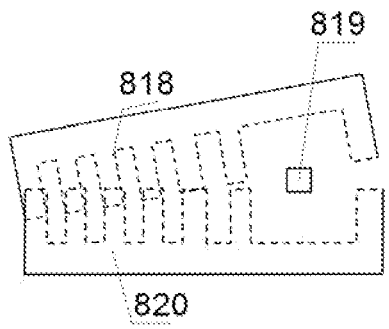
FIG. 8B illustrates a top view of two asymmetric trenches with a contact hole consistent with the disclosed embodiments.

FIGS. 8A-8B illustrate additional exemplary configurations of trench structures in the trench MOSFET device 400 consistent with the disclosed embodiments. As shown in FIGS. 8A-8B, the trench MOSFET device 400 (e.g., a cell of the trench MOSFET device 400) may include a first trench 818, a second trench 820, and a contact hole 819.

The first trench 818 may be a pectinate trench containing a plurality of "tooth" trenches or grooves. The second trench 820 may also be a pectinate trench mirroring the first trench 818 such that the first trench 818 and the second trench 820 are symmetrically arranged. That is, the "tooth" trenches of the first trench 818 may be arranged to face the "tooth" trenches of the second trench 820 to make a symmetric structure. The contact hole 819 is located on the symmetric line of the symmetric structure of the first trench 818 and the second trench 820, and the gate oxide and gate material are filled both in the first trench 818 and the second trench 820 in sequence.

Alternatively, the arrangement of the first trench 818 and the second trench 820 can also be an asymmetric structure. For example, the "tooth" trenches of the first trench 818 may be arranged to be staggered with "tooth" trenches of the second trench 820 (i.e., in a zigzag configuration) such that the "tooth" trenches of the first trench 818 and the second trench 820 can mesh with each other. FIG. 8B illustrates an exemplary configuration that both of the first trench 818 and the second trench 820 include a pectinate trench and are arranged asymmetrically to form an asymmetric trench pair with the tooth trenches of the first trench 818 meshing with the tooth trenches of the second trench 820.

As explained previously, the total length of the dashed lines shown in FIGS. 8A-8B is the width of the channel. Compared with the conventional trench MOSFET devices, the width of the channel is significantly increased and the channel resistance is decreased.

Figure 9:
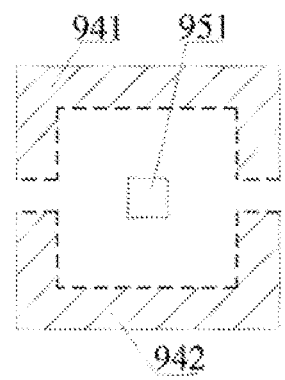
FIG. 9 illustrates top view of other two symmetric trenches with a contact hole consistent with the disclosed embodiments.

FIG. 9 illustrates another exemplary configuration of trenches in the trench MOSFET device 400 consistent with the disclosed embodiments. As shown in FIG. 9, the trench MOSFET device 400 (e.g., a cell of the trench MOSFET device 400) may include a first trench 941, a second trench 942, and a contact hole 951.

The first trench 941 may be part of a square, and the second trench 942 may also be part of a square, mirroring the first trench 941, such that the first trench 941 and the second trench 942 are symmetrically arranged. The contact hole 951 is located on the symmetric line of the symmetric structure of the first trench 941 and the second trench 951, and the gate oxide and gate material are filled both in the first trench 941 and the second trench 951 in sequence.

Figure 1:
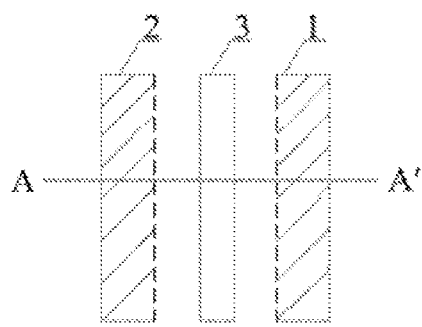
FIG. 1 is a top view of a conventional strip-type trench with a contact hole.
Figure 2:
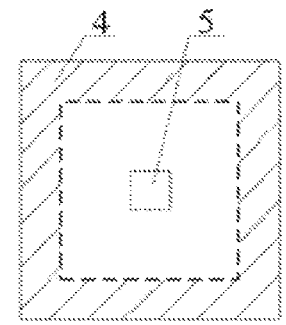
FIG. 2 is a top view of a conventional square trench with a contact hole.
Figure 3:
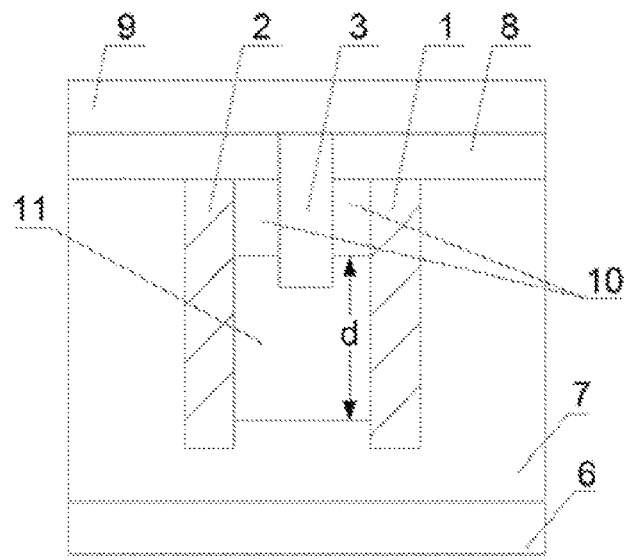
FIG. 3 is a cross-sectional view of the conventional strip-type trench.

The part of square of the first trench 941 and the part of the square of the second trench 951 may be configured in such a way that the total length of the dashed lines shown in FIG. 9 may be longer than that of a square-type trench (e.g., FIG. 2). Further, the arrangement of the first trench 941 and the second trench 942 may be asymmetric (e.g., staggered or zigzag) to further increase the total length of the dashed lines, i.e., the width of the channel. That is, when the area of the cell is fixed, the two-trench configuration as shown in FIG. 9 may increase the width of the channel and reduce the channel resistance.

Figure 10:
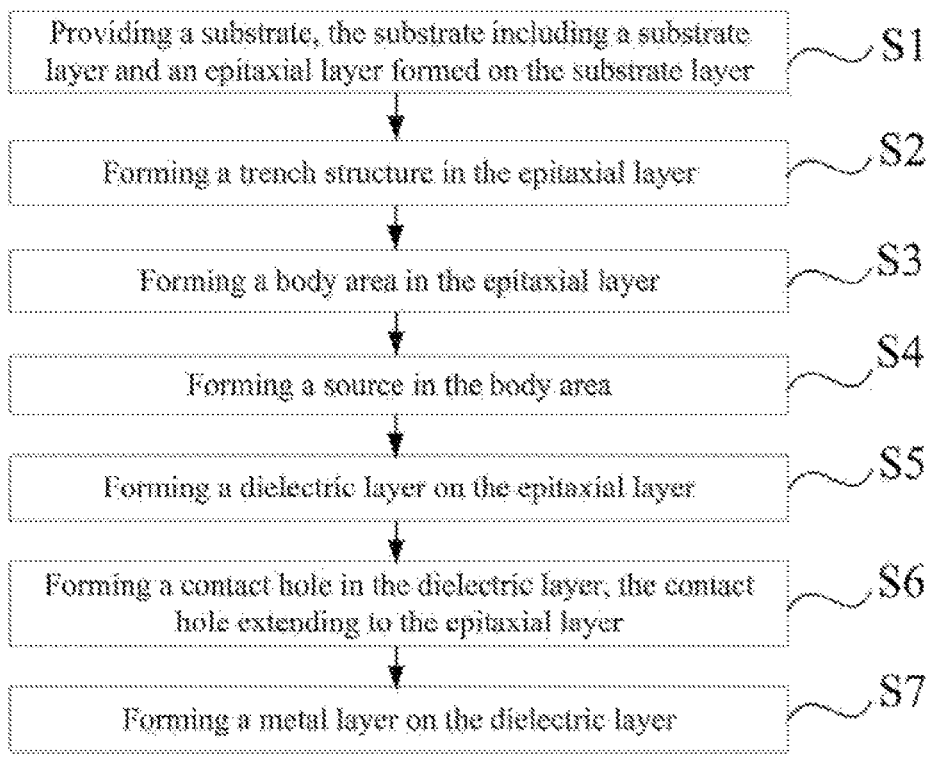
FIG. 10 illustrates a flow chart of fabricating a trench MOSFET device consistent with the disclosed embodiments.

FIG. 10 illustrates an exemplary process 1000 for fabricating a trench MOSFET device consistent with the disclosed embodiments. Because the process 1000 may be corresponding to the trench MOSFET device 400 as previously described, certain descriptions of the process 1000 may be omitted in light of the previous descriptions of the trench MOSFET device 400.

As shown in FIG. 10, at the beginning, a substrate may be provided (S1). The substrate may include a substrate layer and an epitaxial layer formed on the substrate layer. The substrate layer may be a silicon substrate, and the epitaxial layer may have the same lattice structure as the substrate layer.

Various structures may be on or in the epitaxial layer by performing lithography, etching, and/or implantation, etc., processes. The term "on the epitaxial layer" means a space starting from the surface of the epitaxial layer and extending upwards, and the space does not belong to the epitaxial layer (or the substrate) itself. The term "in the epitaxial layer" means a space starting from the upper surface of the epitaxial layer and extending downwards certain depth, and the space is a part of the epitaxial layer (or the substrate).

After the substrate is provided (S1), a trench structure is formed in the epitaxial layer (S2). The trench structure may be formed using a trench pattern obtained by a series of steps such as coating photoresist, exposing, developing, and etching, etc. The trench pattern may include a pattern for a single pectinate trench including a plurality of "tooth" trenches or grooves. The trench pattern may also include a pattern for two trenches, one with a pectinate shape and the other with an approximate square, hexagon, or circle shape. Further, the trench pattern may also include a pattern for two trenches, both with pectinate shapes, arranged in a symmetric or asymmetric configuration, or each of the two trenches may be a partial square shape arranged in a symmetric or asymmetric configuration. Other patterns may also be used.

Further, a body region is formed in the epitaxial layer (S3). The body region may be formed by implantation, and the doping type of the body region may be opposite to the doping type of the epitaxial layer. Afterwards, a source region is formed in the body region (S4). The source region may also be formed by implantation, and the doping type of the source region may be opposite to the doping type of the body region.

A dielectric layer may also be formed on the epitaxial layer (S5). The dielectric layer may be silicon dioxide and may be formed on the epitaxial layer by chemical vapor deposition or physical vapor deposition. After the dielectric layer is formed, a contact hole may be formed in the dielectric layer (S6). The contact hole may extend to the epitaxial layer, and may be formed in the dielectric layer by photolithography and etching. Further, the contact hole may extend to the body region in the epitaxial layer, and metal material, such as wolfram, may be filled in the contact hole for form metal contact.

Further, a metal layer may be formed on the dielectric layer (S7). The metal layer may be formed on the dielectric layer by chemical vapor deposition or physical vapor deposition, and the metal layer may be connected to the source via the metal material in the contact hole (i.e., the metal contact). The metal layer may include any appropriate type of metal, such as Titanium or Aluminum copper alloy. Other processes may also be performed for fabricating the trench MOSFET device.

By using the disclosed methods and devices, the width of the channel of the trench MOSFET device is significantly increased, the channel resistance is reduced, and the on-state resistance is also reduced. Further, multiple trenches and trench types are used to increase the width of the channel and also to reduce the number of contact holes.

It is understood that the disclosed embodiments may be applied to any appropriate semiconductor device manufacturing processes and can also be extended to the manufacturing of various types of MOSFET devices and similar semiconductor devices. Various alternations, modifications, or equivalents to the technical solutions of the disclosed embodiments can be obvious to those skilled in the art.

What is claimed is:

1. A trench Metal-Oxide-Semiconductor Field-Effect Transistor (MOSFET) device, comprising:
    a substrate including a substrate layer and an epitaxial layer formed on the substrate layer;
    a body region formed in the epitaxial layer;
    a source region formed in the body region of the epitaxial layer;
    a dielectric layer formed on the epitaxial layer;
    a metal layer formed on the dielectric layer;
    a contact hole formed in the dielectric layer to connect the source region with the metal layer; and
    a trench structure formed in the epitaxial layer,
    wherein the trench structure includes a first trench that is a pectinate trench including a plurality of tooth trenches and a bar trench interconnecting the plurality of tooth trenches, wherein a total length of all of the plurality of tooth trenches corresponds to a channel width of the MOSFET device, and
    wherein the channel width is equal to a contact hole side outer perimeter of the trench structure.

2. The trench MOSFET device according to claim 1, wherein the trench structure further includes:
    a second trench in a shape of one of a square, a hexagon, and a circle, the second trench being connected to the first trench.

3. The trench MOSFET device according to claim 2, wherein:
    a length of middle tooth trenches is less than a length of an edge tooth trenches such that tooth trenches from different cells can be distinguished.

4. The trench MOSFET device according to claim 1, wherein the trench structure further includes:
    a second trench that is also a pectinate trench and arranged symmetrically with the first trench to form a symmetric trench pair along a symmetric line; and
    the contract hole is located on the symmetric line.

5. The trench MOSFET device according to claim 1, wherein the trench structure further includes:
    a second trench that is also a pectinate trench and arranged asymmetrically with the first trench to form an asymmetric trench pair with the plurality of tooth trenches of the first trench meshing with the plurality of tooth trenches of the second trench.

6. The trench MOSFET device according to claim 1, wherein:
    a total number of the plurality of tooth trenches is six; and
    the contact hole is located in the middle of the plurality of tooth trenches.

7. The trench MOSFET device according to claim 1, wherein:
    the trench structure is filled with gate oxide and polysilicon to form a gate region of the MOSFET device controlling a channel of the MOSFET device.

8. The trench MOSFET device according to claim 1, further including:
    a drain formed on a back side of the substrate layer.

9. A method for fabricating a trench Metal-Oxide-Semiconductor Field-Effect Transistor (MOSFET) device, comprising:
    providing a substrate including a substrate layer and an epitaxial layer formed on the substrate layer;
    forming a trench structure in the epitaxial layer using a trench pattern, wherein the trench pattern includes a first pattern for a first trench that is a pectinate trench including a plurality of tooth trenches and a bar trench interconnecting the plurality of tooth trenches, wherein a total length of all of the plurality of tooth trenches corresponds to a channel width of the MOSFET device, and
    wherein the channel width is equal to a contact hole side outer perimeter of the trench structure;
    forming a body region in the epitaxial layer;

forming a source region in the body region of the epitaxial layer;

forming a dielectric layer on the epitaxial layer;

forming a contact hole formed in the dielectric layer; and forming a metal layer on the dielectric layer, wherein the contact hole is filled with metal material to connect the source region with the metal layer.

10. The method according to claim 9, wherein the trench pattern further includes:

a second pattern for a second trench in a shape of one of a square, a hexagon, and a circle, the second trench being connected to the first trench.

11. The method according to claim 9, wherein the trench pattern further includes:

a second pattern for a second trench that is also a pectinate trench and arranged symmetrically with the first trench to form a symmetric trench pair along a symmetric line; and the contract hole is located on the symmetric line.

12. The method according to claim 9, wherein the trench pattern further includes:

a second pattern for a second trench that is also a pectinate trench and arranged asymmetrically with the first trench to form an asymmetric trench pair with the plurality of tooth trenches of the first trench meshing with the plurality of tooth trenches of the second trench.

13. The method according to claim 9, wherein:

a total number of the plurality of tooth trenches is six; and the contact hole is located in the middle of the plurality of tooth trenches.

14. The method according to claim 9, further including:

filling the trench structure with gate oxide and polysilicon to form a gate region of the MOSFET device controlling a channel of the MOSFET device.

15. The trench MOSFET device according to claim 1, wherein the trench structure further includes a second trench, the second trench including an opened square trench connecting with the bar trench of the first trench.

16. The trench MOSFET device according to claim 2, wherein the second trench connects with the bar trench of the first trench.

17. The trench MOSFET device according to claim 1, wherein the trench structure further includes a second trench, the second trench including a portion of a square trench connecting with the bar trench of the first trench.

18. The trench MOSFET device according to claim 4, wherein the second trench is arranged symmetrically mirroring with the first trench.

19. The trench MOSFET device according to claim 4, wherein each of the first trench and the second trench further includes an additional trench having a shape of one of a square, a hexagon, and a circle, the additional trench connecting with the bar trench of each of the first trench and the second trench.

* * * * *